(12) United States Patent
Choi et al.

(10) Patent No.: US 9,793,518 B2
(45) Date of Patent: Oct. 17, 2017

(54) APPARATUS FOR SEPARATING SUBSTRATE AND METHOD OF SEPARATING SUBSTRATE BY USING THE SAME

(71) Applicant: Samsung Display Co., Ltd., Yongin-si, Gyeonggi-do (KR)

(72) Inventors: Wonwoo Choi, Yongin-si (KR); Seungho Yoon, Yongin-si (KR); Cheryong Hwang, Yongin-si (KR); Sangbong Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/089,289

(22) Filed: Apr. 1, 2016

(65) Prior Publication Data

US 2017/0077459 A1     Mar. 16, 2017

(30) Foreign Application Priority Data

Sep. 10, 2015   (KR) .......................... 10-2015-0128564

(51) Int. Cl.
*B32B 38/10*   (2006.01)
*H01L 51/56*   (2006.01)
(Continued)

(52) U.S. Cl.
CPC ........ *H01L 51/56* (2013.01); *H01L 21/67092* (2013.01); *H01L 21/6838* (2013.01); *H01L 51/003* (2013.01); *B32B 38/10* (2013.01); *B32B 43/006* (2013.01); *H01L 2251/5338* (2013.01); *Y10T 156/1132* (2015.01); *Y10T 156/1168* (2015.01); *Y10T 156/1944* (2015.01); *Y10T 156/1978* (2015.01)

(58) Field of Classification Search
CPC . B32B 38/10; B32B 43/006; Y10T 156/1132; Y10T 156/1168; Y10T 156/1944; Y10T 156/1978
USPC .................. 156/707, 714, 758, 764, 924
See application file for complete search history.

(56) References Cited

U.S. PATENT DOCUMENTS 4,850,780 A * 7/1989 Safabakhsh ....... H01L 21/67132
156/765
5,482,899 A * 1/1996 McKenna ............ B28D 5/0082
156/716

(Continued)

FOREIGN PATENT DOCUMENTS

KR   10-2009-0036427 A   4/2009
KR   10-2009-0114195 A   11/2009
(Continued)

*Primary Examiner* — Mark A Osele
*Assistant Examiner* — Nickolas Harm
(74) *Attorney, Agent, or Firm* — Knobbe Martens Olson & Bear LLP

(57) ABSTRACT

An apparatus for separating a substrate and a method of separating a substrate by using the same are disclosed. In one aspect, the apparatus includes a stage and an adsorber facing the stage and comprising a plurality of vacuum pad portions. An upper surface of the stage includes a first region and a pair of second regions located on opposing sides of the first region, wherein the first region and the second regions are disposed on different planes, and wherein each of the second regions is inclined with respect to the first region.

20 Claims, 8 Drawing Sheets

(51) Int. Cl.
*H01L 51/00* (2006.01)
*H01L 21/67* (2006.01)
*H01L 21/683* (2006.01)
*B32B 43/00* (2006.01)

(56) References Cited

U.S. PATENT DOCUMENTS

| | | | | |
|---|---|---|---|---|
| 5,589,029 A | * | 12/1996 | Matsui | H05K 13/0421 |
| | | | | 156/765 |
| 6,039,833 A | * | 3/2000 | Freund | H01L 21/67132 |
| | | | | 156/707 |
| 9,333,736 B2 | * | 5/2016 | Kumakura | B32B 43/006 |
| 2004/0166653 A1 | * | 8/2004 | Kerdiles | G01N 19/04 |
| | | | | 438/458 |
| 2009/0266471 A1 | | 10/2009 | Kim et al. | |
| 2010/0181019 A1 | * | 7/2010 | Kino | H01L 21/67132 |
| | | | | 156/247 |
| 2011/0204361 A1 | | 8/2011 | Nishiki et al. | |
| 2012/0080150 A1 | * | 4/2012 | Riege | H01L 21/67092 |
| | | | | 156/752 |
| 2012/0145332 A1 | * | 6/2012 | Chien | H01L 21/67132 |
| | | | | 156/758 |
| 2013/0048224 A1 | * | 2/2013 | George | H01L 21/67282 |
| | | | | 156/752 |
| 2013/0272837 A1 | * | 10/2013 | Nakazawa | H01L 21/67132 |
| | | | | 414/800 |
| 2014/0138032 A1 | * | 5/2014 | Kweon | B32B 43/006 |
| | | | | 156/712 |
| 2014/0209250 A1 | * | 7/2014 | Kawagoe | B32B 43/006 |
| | | | | 156/701 |
| 2014/0231001 A1 | * | 8/2014 | Tsai | B32B 37/1284 |
| | | | | 156/247 |
| 2015/0217556 A1 | * | 8/2015 | Lee | B32B 43/006 |
| | | | | 156/702 |

FOREIGN PATENT DOCUMENTS

KR   10-2010-0070730 A   6/2010
KR   10-2015-0028005 A   3/2015

* cited by examiner

APPARATUS FOR SEPARATING SUBSTRATE AND METHOD OF SEPARATING SUBSTRATE BY USING THE SAME

CROSS-REFERENCE TO RELATED APPLICATION

This application claims the benefit of Korean Patent Application No, 10-2015-0128564, filed on Sep. 10, 2015, in the Korean Intellectual Property Office, the disclosure of which is incorporated herein in its entirety by reference.

BACKGROUND

Field

The described technology generally relates to an apparatus for separating a substrate and a method of separating a substrate by using the same.

Description of the Related Technology

Along with efforts to provide consumer electronics showing various form factors, research has been directed to the use of thin and flexible display device.

In the case of a display device that uses a heavy, rigid and fragile glass substrate, a limitation is placed on portability and scaling the size of the display. Therefore, research and development has been emphasized for an organic light-emitting diode (OLED) display that is not only lightweight and resistant to impact but also has flexibility by use of a non-rigid substrate such as a plastic sheet+.

SUMMARY OF CERTAIN INVENTIVE ASPECTS

One inventive aspect is an apparatus for separating a substrate and a method of separating a substrate by using the same in order to resolve non-separation of a flexible substrate from a carrier substrate.

Another aspect is an apparatus for separating a substrate that includes: a stage; and an adsorber facing the stage and including a plurality of vacuum pad portions, wherein an upper surface of the stage includes: a first region; and second regions located on both sides of the first region, and each of the second regions is disposed on a plane different from a plane on which the first region is disposed to form an inclination with respect to the first region.

A minor angle between each of the second regions and the first region may be an obtuse angle.

An area of the first region may be greater than an area of each of the second regions.

The adsorber may include: a first vacuum pad portion facing the first region; and second vacuum pad portions located on both sides around the first vacuum pad portion, and facing the second region.

Each of the second vacuum pad portions may be tiltable with respect to the first vacuum pad portion.

Each of the second vacuum pad portions may perform at least one of a first tilting operation in a direction toward the stage and a second tilting operation in a direction away from the stage.

Another aspect is a method of separating a substrate that includes: loading on a stage a carrier substrate including one side on which a flexible substrate is formed; forming a crack in both ends of the flexible substrate; and separating the carrier substrate from the flexible substrate including the crack.

An upper surface of the stage may include: a first region and a second region disposed on a plane different from that of the first region to form an inclined plane with respect to the first region.

The second region may be provided on both sides around the first region.

The flexible substrate may include: a first flexible layer located on the carrier substrate; a buffer layer located on the first flexible layer and covering an end of the first flexible layer; and a second flexible layer located on the buffer layer and covering an end of the buffer layer.

The end of the buffer layer may directly contact the carrier substrate.

An end of the second flexible layer may directly contact the carrier substrate.

A plurality of display portions may be formed on the flexible substrate.

The method may further include: irradiating a laser to the flexible substrate via the carrier substrate.

The method may further include: connecting an adsorber facing the stage with the carrier substrate, wherein the forming of the crack may include: bending an end of the carrier substrate by using the adsorber, The adsorber may include: a first vacuum pad portion and second vacuum pad portions located on both sides around the first vacuum pad portion and tiltable with respect to the first vacuum pad portion.

The forming of the crack may include: tilting each of the second vacuum pad portions in a direction toward the stage; and tilting each of the second vacuum pad portions in a direction away from the stage.

Another aspect is an apparatus for separating a substrate, the apparatus comprising: a stage; and an adsorber facing the stage and comprising a plurality of vacuum pad portions, wherein an upper surface of the stage comprises: a first region; and a pair of second regions located on opposing sides of and adjacent to the first region, wherein each of the second regions is at an incline with respect to the first region.

In the above apparatus, the incline of each of the second regions forms an obtuse angle with respect to the first region. In the above apparatus, the first region is greater in area than each of the second regions. In the above apparatus, the adsorber comprises: a first vacuum pad portion facing the first region; and a pair of second vacuum pad portions located on opposing sides of the first vacuum pad portion, and facing the second regions. In the above apparatus, each of the second vacuum pad portions is tiltable with respect to the first vacuum pad portion. In the above apparatus, each of the second vacuum pad portions is configured to perform at least one of a first tilting operation in a direction extending toward the stage and a second tilting operation in a direction extending away from the stage.

Another aspect is a method of separating a substrate, the method comprising: loading on a stage a carrier substrate having one side on which a flexible substrate is formed; forming a crack in opposing ends of the flexible substrate; and separating the carrier substrate from the cracked flexible substrate.

In the above method, an upper surface of the stage comprises: a first region and a second region disposed on different planes and inclined with respect to each other. In the above method, the second region is provided on opposing sides of the first region. In the above method, the flexible substrate comprises: a first flexible layer located over the carrier substrate; a buffer layer located over the first flexible layer and covering an end of the first flexible layer; and a second flexible layer located over the buffer layer and covering an end of the buffer layer.

In the above method, the end of the buffer layer directly contacts the carrier substrate. In the above method, an end of the second flexible layer directly contacts the carrier substrate. In the above method, a plurality of display portions are formed over the flexible substrate. The above method further comprises: irradiating a laser beam to the flexible substrate via the carrier substrate. The above method further comprises: connecting an adsorber facing the stage with the carrier substrate, wherein the forming of the crack comprises: bending an end of the carrier substrate via the adsorber. In the above method, the adsorber comprises: a first vacuum pad portion and a pair of second vacuum pad portions located on opposing sides of the first vacuum pad portion and tiltable with respect to the first vacuum pad portion. In the above method, the forming of the crack comprises: tilting each of the second vacuum pad portions in a direction extending toward the stage; and tilting each of the second vacuum pad portions in a direction extending away from the stage.

Another aspect is an apparatus for separating a substrate, the apparatus comprising: a stage; and an adsorber facing the stage, wherein an upper surface of the stage comprises: a first region; and a pair of second regions located on opposing sides of the first region, wherein the adsorber comprises a first vacuum pad portion facing the first region and a pair of second vacuum pad portions located on opposing sides of the first vacuum pad portion, and facing the second regions, and wherein at least one of the second vacuum pad portions is tiltable with respect to the first vacuum pad portion.

In the above apparatus, each of the second regions forms an obtuse angle with the first region. In the above apparatus, the first region is greater in area than each of the second regions.

At least one of the disclosed embodiments allows separation of a flexible substrate from a carrier substrate via a relatively simple process.

BRIEF DESCRIPTION OF THE DRAWINGS

These and/or other aspects will become apparent and more readily appreciated from the following description of the exemplary embodiments, taken in conjunction with the accompanying drawings.

DETAILED DESCRIPTION OF CERTAIN INVENTIVE EMBODIMENTS

Figure 1:
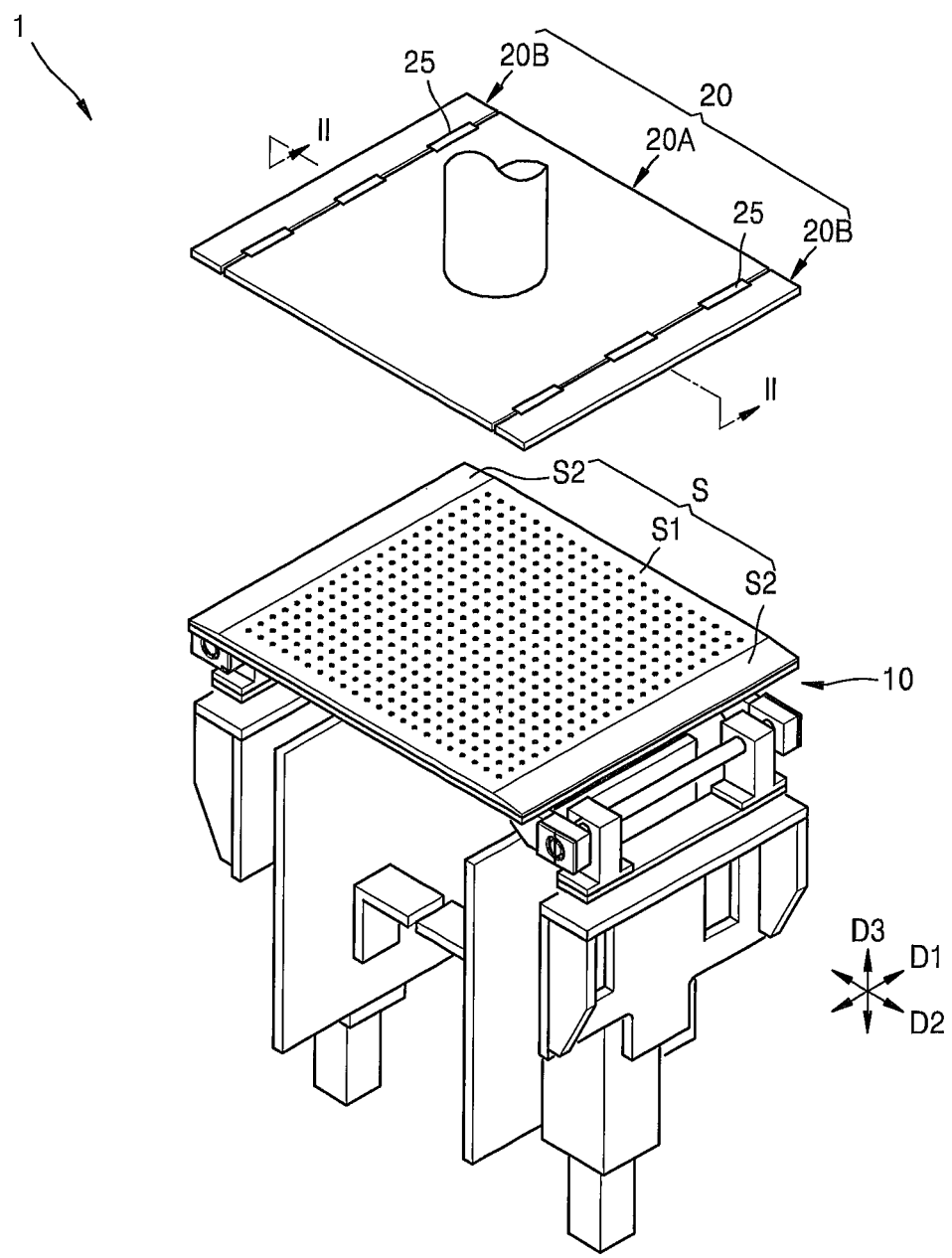
FIG. 1 is a perspective view illustrating an apparatus for separating a substrate according to an exemplary embodiment.

In a process of manufacturing a display device that uses a flexible substrate, there has been a problem that the flexible substrate may not be separated from a carrier substrate.

Exemplary embodiments will be illustrated in the drawings and described in detail in the written description. Effects and characteristics of present exemplary embodiments, and a method of accomplishing them will be apparent by referring to content described below in detail together with the drawings. However, the present exemplary embodiments are not limited to exemplary embodiments below and may be implemented in various forms. When description is made with reference to the drawings, like reference numerals in the drawings denote like or corresponding elements, and repeated description thereof will be omitted.

Expressions such as "at least one of" when preceding a list of elements, modify the entire list of elements and do not modify the individual elements of the list.

As used herein, the term "and/or" includes any and all combinations of one or more of the associated listed items.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween.

For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Figure 2:
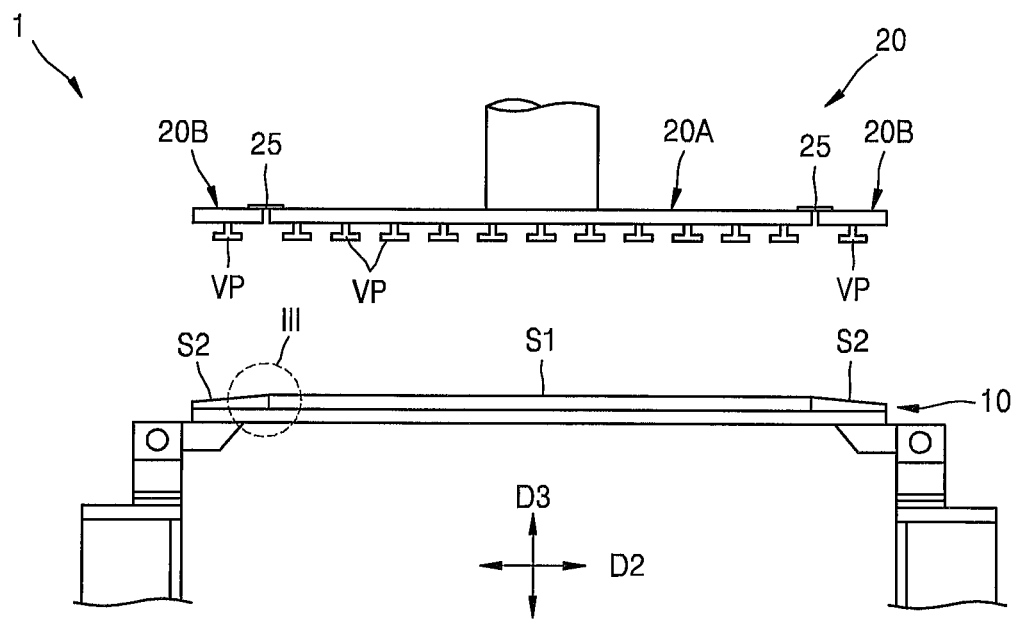
FIG. 2 is a cross-sectional view taken along a line II-II of FIG. 1.
Figure 3:
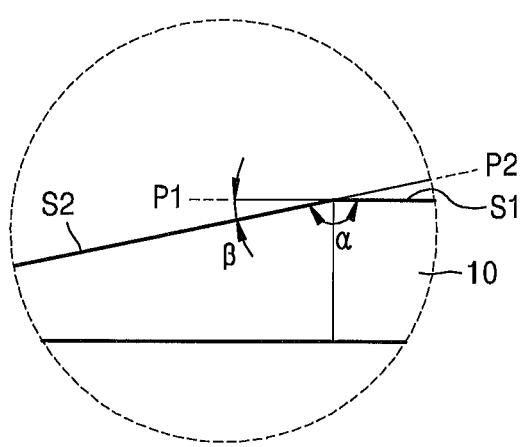
FIG. 3 is an enlarged cross-sectional view illustrating III of FIG. 2.
Figure 4:
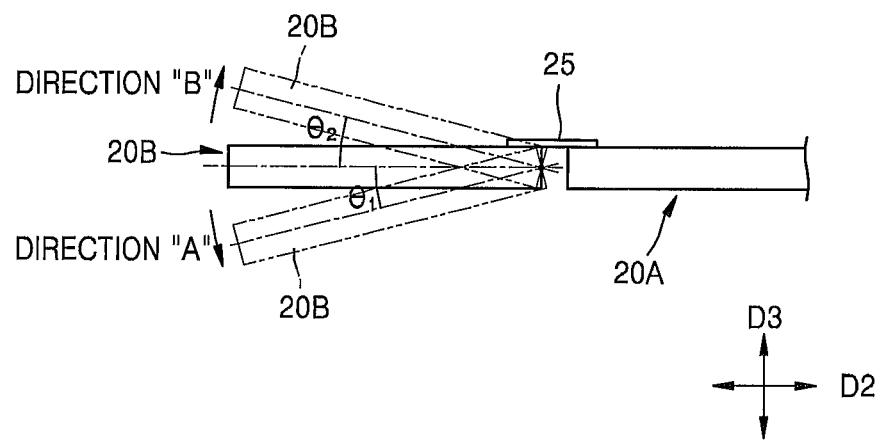
FIG. 4 is a cross-sectional view illustrating a tilting operation of a second vacuum pad portion according to an exemplary embodiment.

FIG. 1 is a perspective view illustrating an apparatus 1 for separating a substrate according to an exemplary embodiment, FIG. 2 is a cross-sectional view taken along a line II-II of FIG. 1, FIG. 3 is an enlarged cross-sectional view illustrating III of FIG. 2, and FIG. 4 is a cross-sectional view illustrating a tilting operation of a second vacuum pad portion according to an exemplary embodiment.

The apparatus 1 includes a stage 10, and an adsorber 20 facing the stage 10.

An upper surface of the stage 10 may include a first region S1 and second regions S2 disposed on both sides of the first region S1. The second regions S2 contact the first region S1, and the area of the first region S1 is greater than the area of each of the second regions S2.

The stage 10 may include an inclined plane. The second region S2 may be disposed on a plane different from that of the first region S1 to form an inclination with respect to the first region S1. For example, as illustrated in FIG. 3, the first region S1 may be disposed on a first virtual plane P1, and each of the second regions S2 may be disposed on a second virtual plane P2 different from the first virtual plane P1.

While one side of the second region S2 contacts the first region S1, the other side of the second region S2 extends oblique with respect to the first region S1, so that the second region S2 may form an inclination with respect to the first region S1. Since the second region S2 forms an inclination in a direction away from the adsorber 20, the distance between the adsorber 20 and the first region S1 of the stage 10 is less than the distance between the adsorber 20 and the second region S2 of the stage 10.

A minor angle between the first and second regions S1 and S2 respectively disposed on different planes may be an obtuse angle. According to an exemplary embodiment, as illustrated in FIG. 3, the first virtual plane P1 on which the first region S1 is disposed and the second virtual plane P2 on which the second region S2 is disposed may form an acute angle β of about 5° or less, and a minor angle α between the first and second regions S1 and S2 may form an obtuse angle.

The adsorber 20 includes a first vacuum pad portion 20A and second vacuum pad portions 20B located on both sides of the first vacuum pad portion 20A. Each of the first and second vacuum pad portions 20A and 20B has vacuum pads VP on a surface facing an upper surface S of the stage 10. The vacuum pads VP may include a material such as urethane, rubber, and silicone.

The first vacuum pad portion 20A is disposed to face the first region S1 of the upper surface S of the stage 10, and the second vacuum pad portions 20B are respectively disposed to face the second regions S2 of the upper surface S of the stage 10.

The second vacuum pad portions 20B are connected with the first vacuum pad portion 20A by using a connection member 25, and each of the second vacuum pad portions 20B is tiltable with respect to the first vacuum pad portion 20A.

Referring to FIG. 4, the second vacuum pad portion 20B is tiltable along a direction "A" toward the stage 10 to form a predetermined angle with respect to the first vacuum pad portion 20A, and is tiltable along a direction "B" away from the stage 10 to form a predetermined angle with respect to the first vacuum pad portion 20A.

According to an exemplary embodiment, the second vacuum pad portions 20B may be tilted along the direction "A" to form a first angle θ1 with the first vacuum pad portion 20A, and then be tilted by a predetermined angle θ1+θ2 along the direction "B". According to another exemplary embodiment, the second vacuum pad portions 20B may be tilted along the direction "B" to form a second angle θ2 with the first vacuum pad portion 20A, and then be tilted by a predetermined angle θ2+θ1 along the direction "A".

Though FIG. 4 illustrates the case where a tilting axis of the second vacuum pad portions 20B is provided to an end of the second vacuum pad portions 20B, exemplary embodiments are not limited thereto. As far as the second vacuum pad portions 20B are tiltable with respect to the first vacuum pad portion 20A, the tilting axis may be changeable between the first and second vacuum pad portions 20A and 20B. For example, the tilting axis may be located at a position passing through the center of the connection member 25.

As in a process described later, the second vacuum pad portions 20B may be tiltable along the direction "A" and/or the direction "B" with a carrier substrate including a flexible substrate on its one side disposed between the stage 10 and the adsorber 20. According to a comparison example, in the case where the entire upper surface S of the stage 10 is designed flat, the second vacuum pad portions 20B are difficult to tilt in the direction "A" with the carrier substrate including the flexible substrate on its one side disposed between the stage 10 and the adsorber 20.

However, according to an exemplary embodiment, since the upper surface S of the stage 10 includes the second region S2, which is an inclined surface, and the second vacuum pad portions 20B are disposed to face the second region S2, the second vacuum pad portions 20B are easy to tilt along the direction "A".

The apparatus 1 can be used for separating the flexible substrate from the carrier substrate.

Figure 5A:
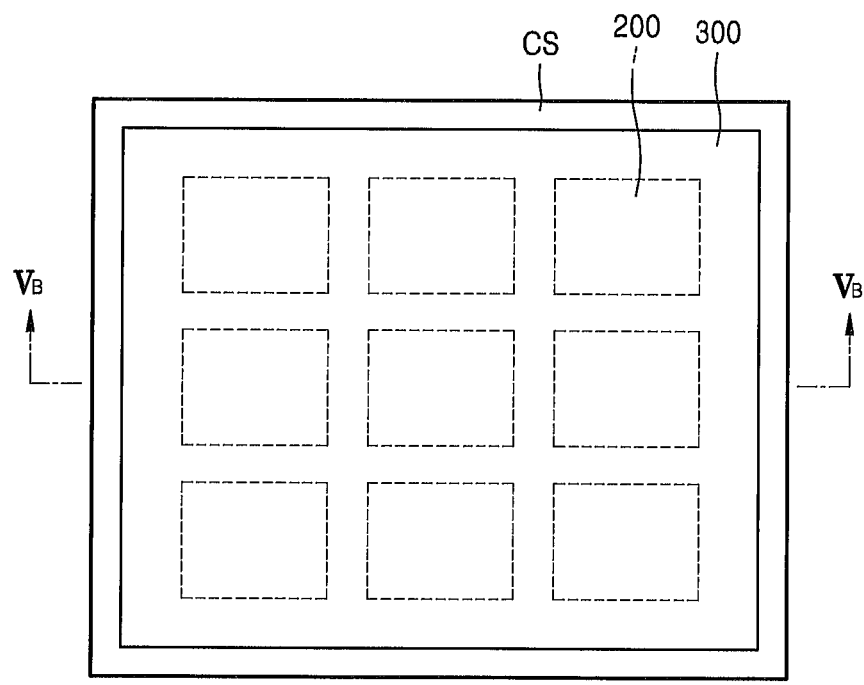
FIG. 5A is a cross-sectional view illustrating a process of manufacturing a display device according to an exemplary embodiment.
Figure 5B:
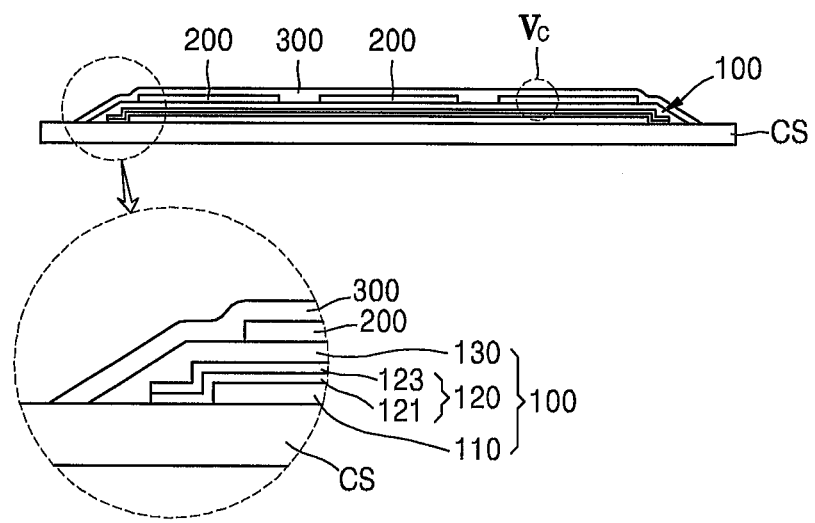
FIG. 5B is a cross-sectional view taken along a line $V_B$-$V_B$ of FIG. 5A.
Figure 5C:
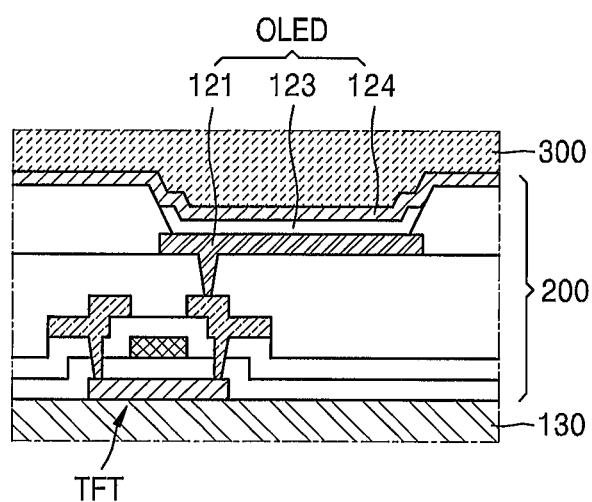
FIG. 5C is an enlarged cross-sectional view illustrating $V_C$ of FIG. 5B.

FIG. 5A is a cross-sectional view illustrating a process of manufacturing a display device according to an exemplary embodiment, FIG. 5B is a cross-sectional view taken along a line $V_B$-$V_B$ of FIG. 5A, and FIG. 5C is an enlarged cross-sectional view illustrating $V_C$ of FIG. 5B.

Referring to FIGS. 5A and 5B, a flexible substrate 100 is formed on one side of a carrier substrate CS. The flexible substrate 100 is a mother substrate. Display portions 200 are formed on the flexible substrate 100, and each of the display portions 200 may correspond to an OLED display.

The carrier substrate CS may include a material such as glass having a rigid property, and serve as a support body while the flexible substrate 100 and a plurality of display portions 200 are formed.

The flexible substrate 100 is formed on one side of the carrier substrate CS, and includes a flexible layer including a plastic material such as polyimide in order to secure flexibility. To prevent transmission of moisture and oxygen due to a defect such as foreign substances or a pinhole in the flexible layer, the flexible substrate 100 may include a plurality of flexible layers 110 and 130, and a buffer layer 120 including an inorganic material may be disposed between the plurality of flexible layers 110 and 130.

According to an exemplary embodiment, the first flexible layer 110 is formed by coating a resin material such as polyimide on the carrier substrate CS and hardening the same. The first flexible layer 110 may include, besides polyimide, polyether sulphone (PES), polyacrylate (PAR), polyether imide (PEI), polyethylene naphthalate (PEN), polyethylene terepthalate (PET), polyphenylene sulfide (PPS), polyallylate, polyimide, polycarbonate (PC), poly arylene ether sulfone, etc.

After that, the buffer layer 120 including the inorganic material is formed by using a method such as chemical vapor deposition (CVD). According to an exemplary embodiment, a first buffer layer 121 including amorphous silicon (a-Si), a silicon oxide (SiOx), and a silicon nitride (SiNx) may be formed, and a second buffer layer 123 including a silicon oxide (SiOx) and a silicon nitride (SiNx) may be formed. The amorphous silicon (a-Si) may improve adhesive force between the first and second flexible layers 110 and 130. The silicon oxide (SiOx) and the silicon nitride (SiNx) may prevent penetration of moisture and oxygen. Though the present exemplary embodiment describes the buffer layer 120 includes two layers, a number of buffer layers 120 may change.

The area of the buffer layer 120 may be greater than the area of the first flexible layer 110. The buffer layer 120 may cover the first flexible layer 110, and an end of the buffer layer 120 may directly contact the carrier substrate CS.

After that, the second flexible layer 130 is formed by coating and hardening a resin material such as polyimide. The second flexible layer 130 may include, besides polyimide, PES, PAR, PEI, PEN, PET, PPS, PC, poly arylene ether sulfone, etc.

While the resin material is coated during a process of forming the second flexible substrate 130, the resin material may overflow and flow toward the carrier substrate CS. The area of the second flexible layer 130 formed while the coated resin material is hardened may be greater than the area of the buffer layer 120. The second flexible layer 130 may cover the buffer layer 120, and an end of the second flexible layer 130 may directly contact the carrier substrate CS.

Referring to FIG. 5C, the display portion 200 is formed on the flexible substrate 100. The display portion 200 may be an OLED display including a thin film transistor (TFT), a capacitor (not shown), and an OLED electrically connected with the TFT formed on the flexible substrate 100. The OLED may include a pixel electrode 210 electrically connected with the TFT, an opposite electrode 230 facing the pixel electrode 210, and an emission layer 220 disposed between the pixel electrode 210 and the opposite electrode 230.

A protective layer 300 is formed on the display portion 200. The protective layer 300 may be a thin film encapsulation film including an organic layer and an inorganic layer.

Figure 6:
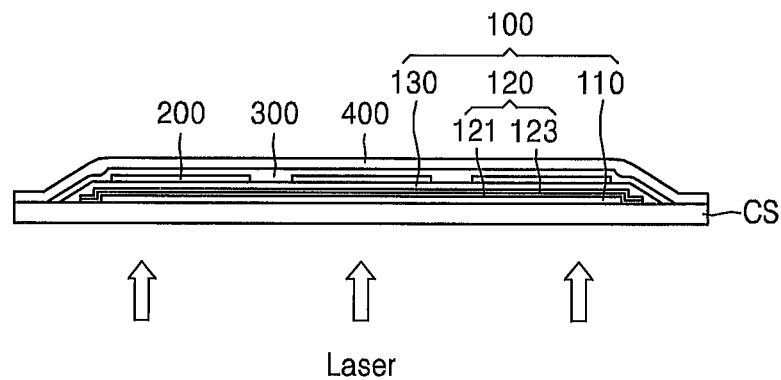
FIG. 6 is a cross-sectional view illustrating a process of manufacturing a display device according to an exemplary embodiment.

FIG. 6 is a cross-sectional view illustrating a process of manufacturing a display device according to an exemplary embodiment.

Referring to FIG. 6, a film 400 may be formed on the protective layer 300. For example, the film 400 may be attached on the protective layer 300 by using an adhesive and prevent the display portion 200 and/or the protective layer 300 from being damaged during the process of manufacturing the display device.

After that, a laser is irradiated to the lower surface of the carrier substrate CS. The laser may be an ultraviolet (UV) ray or a laser having a wavelength of 500 nm or less. The laser is provided to the flexible substrate 100 via the carrier substrate CS. A portion between the carrier substrate CS and the flexible substrate 100, for example, bonding force between the carrier substrate CS and the first flexible layer 110 is weakened by the laser, so that separation between the carrier substrate CS and the first flexible layer 110 becomes easy.

The laser may be irradiated to the entire surface of the flexible substrate 100. The laser is irradiated to not only the first flexible layer 110 but also the buffer layer 120 and the second flexible layer 130 forming an end of the flexible substrate 100. However, since the buffer layer 120, for example, a-Si included in the buffer layer 120 absorbs energy of the laser, bonding force between the second flexible layer 130 and the carrier substrate CS is greater than bonding force between the first flexible layer 110 and the carrier substrate CS.

The carrier substrate CS and the first flexible layer 110 in which bonding force has been weakened by a laser irradiation process may be easily separated, but an end of the flexible substrate 100, and ends of the buffer layer 120 contacting the carrier substrate CS, and the second flexible layer 130 are difficult to separate from the carrier substrate CS.

If a laser is irradiated and the flexible substrate 100 is immediately separated from the carrier substrate CS, an end of the flexible substrate 100 may have a non-separation (non-exfoliation) region.

However, according to exemplary embodiments, since the separation is performed after a crack of the flexible substrate 100 is induced by using the apparatus 1 described with reference to FIGS. 1 to 4, a non-separation (non-exfoliation) defect of the flexible substrate 100 may be prevented.

FIGS. 7 to 10 are cross-sectional views illustrating a method of separating a substrate in a process of manufacturing a display device according to an exemplary embodiment.

Figure 7:
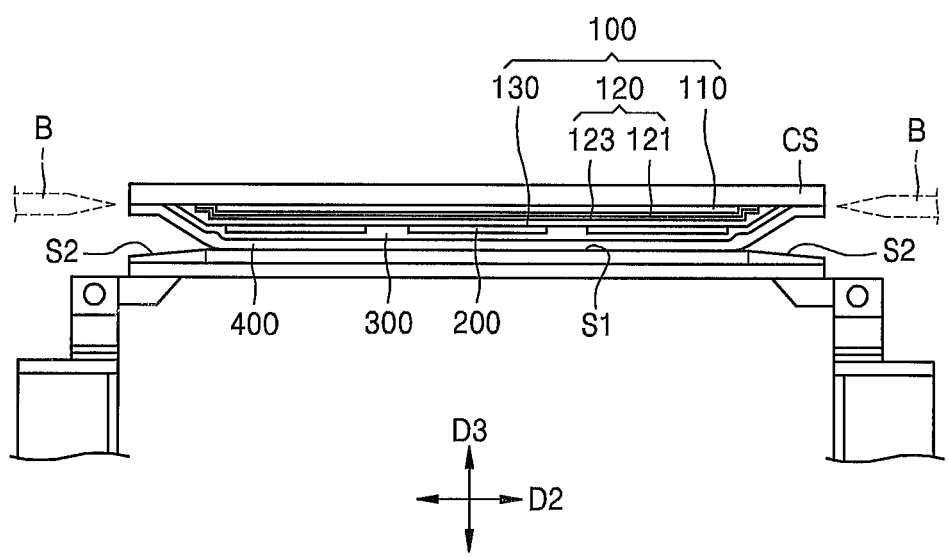
FIGS. 7 to 10 are cross-sectional views illustrating a method of separating a substrate in a process of manufacturing a display device according to an exemplary embodiment.

Referring to FIG. 7, a display device is loaded so that the film 400 may face the stage 10, and the carrier substrate CS may face the adsorber 20. After the loading, the film 400 may be separated from the carrier substrate CS by using a blade B.

Though the present exemplary embodiment describes the case where an object to be separated is loaded on the stage 10 (see FIG. 7) after a laser is irradiated (see FIG. 6), a process order may change. For example, as illustrated in FIG. 7, after a display device is loaded on the stage 10, a laser may be irradiated to the flexible substrate 100 via the carrier substrate CS.

Figure 8:
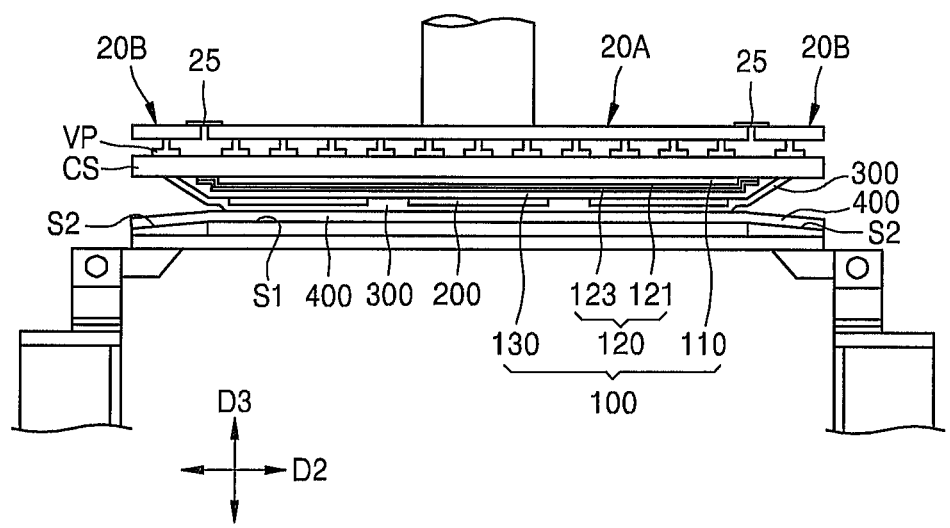

Referring to FIG. 8, the adsorber 20 is connected to the carrier substrate CS. While the vacuum pads vp of the adsorber 20 are adsorbed on the lower surface of the carrier substrate CS, the first vacuum pad portion 20A and the second vacuum pad portions 20B are connected to the carrier substrate CS.

Figure 9:
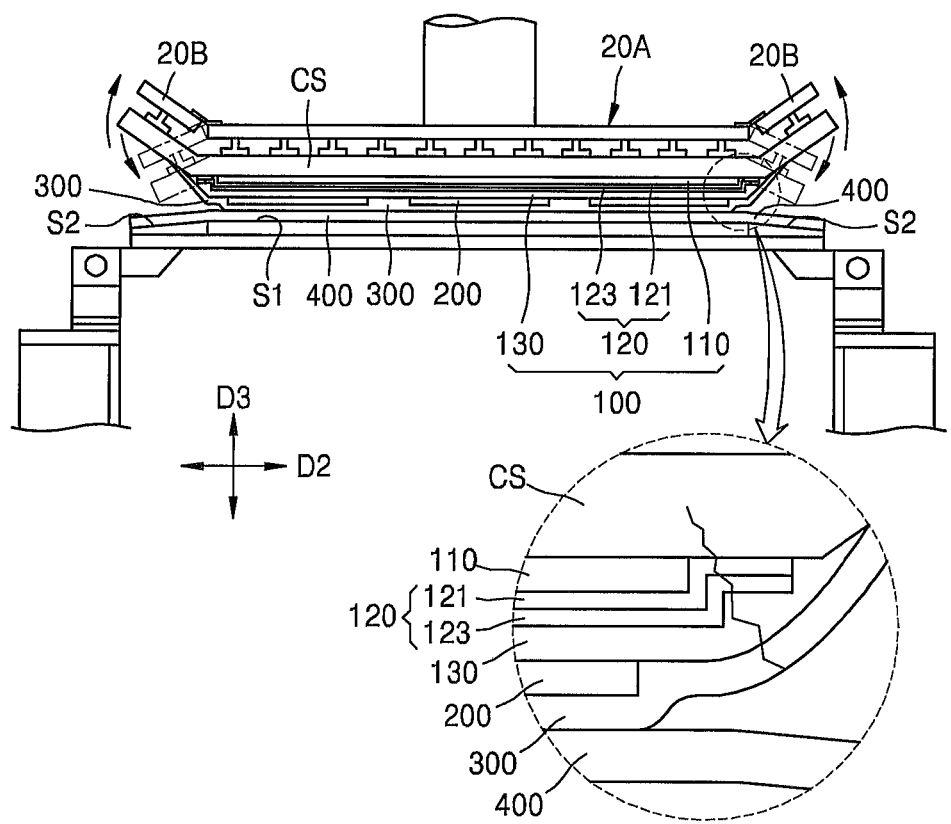

Referring to FIG. 9, a crack is formed in both ends of the flexible substrate 100 by tilting the second vacuum pad portions 20B. As described with reference to FIG. 4 in the above, since the second vacuum pad portions 20B may be tiltable in the direction "A" and the direction "B", when the second vacuum pad portions 20B are tilted in the direction "A" (a first tilting operation) and tilted in the direction "B" (a second tilting operation), a crack is induced in the carrier substrate CS and the flexible substrate 100 formed on the carrier substrate CS.

Since the upper surface S of the stage 10 facing the second vacuum pad portions 20B includes the second regions S2, which are inclined planes, a predetermined crack may be induced by the first tilting operation.

According to a comparison example, in the case where the entire upper surface S of the stage 10 is flat, since no margin exists while a display device is disposed between the stage 10 and the second vacuum pad portions 20B, the second vacuum pad portions 20B is difficult to tilt in the direction "A". That is, the second vacuum pad portions 20B are tiltable in only the direction "B". In this case, since ends of the carrier substrate CS and the flexible substrate 100 are bent in only one direction (the direction "B"), a portion in which a crack is not induced is generated, so that separation of the flexible substrate 100 from the carrier substrate CS may not be easy during a process of separating a substrate which will be described later.

However, according to an exemplary embodiment, since the upper surface S of the stage 10 includes the second region S2, which is an inclined plane, and the second vacuum pad portion 20B is disposed to face the second region S2, the second vacuum pad portion 20B may be tiltable in not only the direction "B" but also the direction "A". Unlike the above-described comparison example, since the second vacuum pad portions 20B are tilted at least two times along the direction "A" and the direction "B" which are opposite directions, cracks may be continuously formed in the flexible substrate 100 to propagate through the flexible substrate 100 in the depth dimension of the flexible substrate 100 as shown in FIG. 9.

Though the present exemplary embodiment describes the second vacuum pad portions 20B are tilted in the direction "A" and then tilted in the direction "B", the order may change. For example, as understood by one of ordinary skill in the art, the second vacuum pad portions 20B may be tilted in the direction "B" and then tilted in the direction "A".

Figure 10:
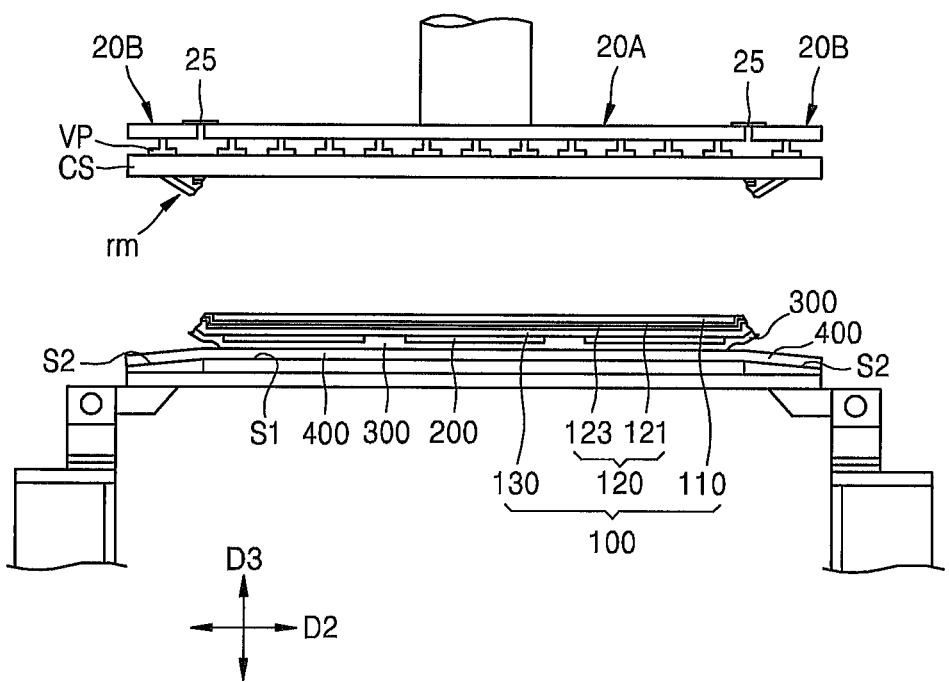

Referring to FIG. 10, the flexible substrate 100 in which a crack is formed is separated from the carrier substrate CS. With the crack formed in the flexible substrate 100, when the adsorber 20 connected with the carrier substrate 100 is moved, the flexible substrate 100 may be easily separated from the carrier substrate CS.

According to an exemplary embodiment, remnants "rm" of the buffer layer 120 contacting the carrier substrate CS and the second flexible substrate 130 may remain on the carrier substrate CS.

Figure 11:
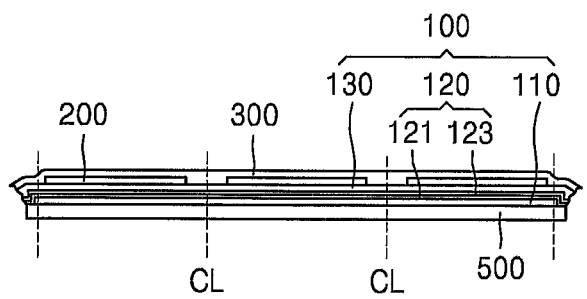
FIG. 11 is a cross-sectional view illustrating a method of manufacturing a display device according to an exemplary embodiment.

FIG. 11 is a cross-sectional view illustrating a method of manufacturing a display device according to an exemplary embodiment.

Referring to FIG. 11, a protective film 500 is formed on the flexible substrate 100 exposed while the flexible substrate 100 is separated from the carrier substrate CS, and the display portions 200 formed on the flexible substrate 100 may be separated into unit display panels by cutting the flexible substrate 100 along a cutting line CL.

Though the above-described exemplary embodiments describe the case where the display device is an OLED display, the inventive concept is not limited thereto. For example, the inventive concept is applicable to a liquid crystal display device formed on the flexible substrate.

Though the inventive technology has been described with reference to exemplary embodiments illustrated in the drawings, these are provided for an exemplary purpose only, and one of ordinary skill in the art will understand that various modifications and other equivalent embodiments may be made therein. Therefore, the spirit and scope of the inventive concept should be defined by the following claims.

What is claimed is:

1. An apparatus for separating a substrate, the apparatus comprising:
    a stage; and
    an adsorber facing the stage and comprising a plurality of vacuum pad portions,
    wherein an upper surface of the stage comprises:
    a first region having a flat surface; and
    a pair of second regions located on opposing sides of and adjacent to the first region, wherein each of the second regions has a flat surface, and wherein the flat surface of each second region is inclined downwardly with respect to the flat surface of the first region.

2. The apparatus of claim 1, wherein the incline of each of the second regions forms an obtuse angle with respect to the first region.

3. The apparatus of claim 1, wherein the first region is greater in area than each of the second regions.

4. The apparatus of claim 1, wherein the adsorber comprises:
    a first vacuum pad portion facing the first region; and
    a pair of second vacuum pad portions located on opposing sides of the first vacuum pad portion, and facing the second regions.

5. The apparatus of claim 4, wherein each of the second vacuum pad portions is tiltable with respect to the first vacuum pad portion.

6. The apparatus of claim 5, wherein each of the second vacuum pad portions is configured to perform at least one of a first tilting operation in a direction extending toward the stage and a second tilting operation in a direction extending away from the stage.

7. The apparatus of claim 1, wherein the width of the first region is smaller than that of the substrate, and wherein each of the second regions is apart from the end portions of the substrate.

8. A method of separating a substrate, the method comprising:
    loading on a stage a carrier substrate having one side on which a flexible substrate is formed;
    forming a crack in opposing ends of the flexible substrate; wherein the crack is formed to propagate through the flexible substrate in the depth dimension of the flexible substrate; and
    separating the carrier substrate from the cracked flexible substrate.

9. The method of claim 8, wherein an upper surface of the stage comprises:
    a first region and a second region disposed on different planes and inclined with respect to each other.

10. The method of claim 9, wherein the second region is provided on opposing sides of the first region.

11. The method of claim 8, wherein the flexible substrate comprises:
    a first flexible layer located over the carrier substrate;
    a buffer layer located over the first flexible layer and covering an end of the first flexible layer; and
    a second flexible layer located over the buffer layer and covering an end of the buffer layer.

12. The method of claim 11, wherein the end of the buffer layer directly contacts the carrier substrate.

13. The method of claim 12, wherein an end of the second flexible layer directly contacts the carrier substrate.

14. The method of claim 8, wherein a plurality of display portions are formed over the flexible substrate.

15. The method of claim 8, further comprising:
    irradiating a laser beam to the flexible substrate via the carrier substrate.

16. The method of claim 8, further comprising:
    connecting an adsorber facing the stage with the carrier substrate,
    wherein the forming of the crack comprises:
    bending an end of the carrier substrate via the adsorber.

17. The method of claim 16, wherein the adsorber comprises:

a first vacuum pad portion and a pair of second vacuum pad portions located on opposing sides of the first vacuum pad portion and tiltable with respect to the first vacuum pad portion.

18. The method of claim 17, wherein the forming of the crack comprises:
tilting each of the second vacuum pad portions in a direction extending toward the stage; and
tilting each of the second vacuum pad portions in a direction extending away from the stage.

19. An apparatus for separating a substrate, the apparatus comprising:
a stage; and
an adsorber facing the stage,
wherein an upper surface of the stage comprises:
a first region; and
at least one second region adjacent to the first region,
wherein the adsorber comprises a first vacuum pad portion facing the first region and at least one second vacuum pad portion adjacent to the first vacuum pad portion, and facing the second region, and wherein the at least one second vacuum pad portion is tiltable with respect to the first vacuum pad portion,
wherein the at least one second region is inclined downwardly from the first region such that the at least one second region has an obtuse angle with respect to the first region, wherein the width of the first region is smaller than that of the substrate, and wherein the at least one second region is apart from the end portion of the substrate.

20. The apparatus of claim 19, wherein the first region is greater in area than each of the second regions.

\* \* \* \* \*